United States Patent [19]

Sonoda et al.

[11] 3,914,858

[45] Oct. 28, 1975

[54] METHOD OF MAKING SEALED CAVITY MOLDED SEMICONDUCTOR DEVICES

[75] Inventors: Sanenobu Sonoda; Masahiro Fujimori; Katsumi Yamamoto; Seiki Kobayashi, all of Osaka, Japan

[73] Assignee: Nitto Electric Industrial Co., Ltd., Ibaragi, Japan

[22] Filed: Aug. 23, 1974

[21] Appl. No.: 499,946

[52] U.S. Cl. ...................... 29/588; 156/153; 29/590

[51] Int. Cl.$^{2}$ ........................................... B01J 17/00

[58] Field of Search .......... 29/588, 627, 590, 576 S; 65/59 B, 32; 156/153; 264/265

[56] References Cited

UNITED STATES PATENTS

| | | | |
|---|---|---|---|
| 3,199,967 | 8/1965 | Pixley | 65/59 B |
| 3,370,977 | 2/1968 | Anderson | 156/153 |
| 3,793,064 | 2/1974 | Budd | 29/627 |

*Primary Examiner*—W. Tupman
*Attorney, Agent, or Firm*—Sughrue, Rothwell, Mion, Zinn & Macpeak

[57] ABSTRACT

A method of making a cavity molded type semiconductor device with an external lead frame is disclosed wherein the external lead frame is prepared with a liquid honing treatment prior to its being molded into a base portion after molding, and after molding, the portion of the lead frame extending into a cavity and the mating surface of the base portion are again subjected to a liquid honing treatment. The two liquid honing treatments serve to markedly increase the ability to prevent leakage of atmospheric air into the sealed cavity of the finished molded semiconductor device.

6 Claims, 3 Drawing Figures

METHOD OF MAKING SEALED CAVITY MOLDED SEMICONDUCTOR DEVICES

BACKGROUND OF THE INVENTION

1. Field of the Invention

This invention relates to a method of making a sealed cavity molded semiconductor device wherein semiconductor elements themselves or semiconductor elements in an integrated circuit are completely protected from external atmosphere.

2. Description of Prior Art

In order to protect a semiconductor element from the external atmosphere, it has been proposed that the semiconductor element be directly buried into a molding material. In this case, however, since the thermal expansion coefficients of the molding material and the semiconductor element are different from each other, stresses may be applied to the semiconductor element, and the resulting strain is given thereto due to the change of temperature when the semiconductor element is molded or the semiconductor device thus obtained is operated. As a result, the semiconductor element may often be damaged or the lead wires of the semiconductor device may be disconnected.

To eliminate the described disadvantages, a plastic sealed split casing cavity molded type semiconductor device has been developed, which avoids directly molding the semiconductor element into the molding material.

Examples of the cavity molded type semiconductor devices are shown in FIGS. 1 and 2.

A method of fabricating a molded split casing semiconductor device shown in FIG. 1 is first described. A semiconductor element 2 is mounted on a header 1 of an insulating member in cavity 18, and external lead frames 3 and 3' of copper, Kovar or the like are mounted on the header 1 through a binder, preferably, a plastic system binder 4. Thereafter, internal lead wires 5 and 5', such as aluminum wire, gold wire or the like, are bonded to the semiconductor element 2 and the external lead frames 3 and 3' respectively. Finally, a cap 7 with a hollow 6 is mounted on the header 1 by a binder 8, preferably the same plastic system binder used to seal the semiconductor element 2.

In the semiconductor device shown in FIG. 2, a semiconductor element 2 is mounted on a header 11 in cavity 19, in which external lead frames 3 and 3' are embedded within header 11 during the molding of the header using a material of powdery epoxy resin. Thereafter, internal lead wires 5 and 5' are bonded to the semiconductor element 2 and the external lead frames 3 and 3' respectively. Finally, a cap 17 is mounted on the header 11 through a binder 14, preferably an epoxy resin system binder.

However, since the cavity molded type semiconductor devices thus obtained have poor adherence between the external lead frame, the binder and the molding material to one another, the semiconductor element is insufficiently protected from the external atmosphere. For this reason such fabricating techniques are not generally employed.

SUMMARY OF THE INVENTION

The inventors have found at the result of various experiments that if an external lead frame is prepared with a liquid honing treatment prior to the molding into the header in the fabrication process of the cavity molded type semiconductor device, the semiconductor device can almost completely be protected from the external atmosphere.

It is possible by honing the external lead frame by means of a liquid honing treatment to roughen the surface of the external lead frame so as to maintain the airtight property of the semiconductor device.

In the present invention, the surface roughness of the external lead frame, particularly suitable to maintaining the airtight property of the semiconductor device, is 2 to 10 microns in Rz which is defined by JIS B 0601. The surface roughness is obtained by preparing the external lead frame with a liquid honing treatment, using a mixed liquid honing material which consists of water as the liquid and artificial emery abrasive (defined by JIS R 6111) of 5 to 80 microns grain size as the abrasive and whose mixed ratio is 2:0.5–1 by volume.

In addition, if a known water soluble antioxidant is added to the liquid honing material used in the invention, a rust preventing effect may be applied to the external lead frame.

DESCRIPTION OF PREFERRED EMBODIMENT

One embodiment of the present invention will now be described with respect to a particular example.

Example

A Kovar external lead frame 250 microns in thickness and 500 microns in width and having 24 leads is first masked with a polyethylene mask plate having 1 mm thickness. Thereafter, only unmasked portions of the lead frame to be molded in the latter molding process are subjected to a liquid honing treatment. The surface roughness of such a lead frame is 4 to 6 microns in Rz value defined by JIS B 0601. The liquid honing treatment is carried out by means of a liquid honing apparatus made by Fujiseiki Co., Ltd. The external lead frame is prepared at 1 Sec/cm$^2$ and at 3 Kg/cm$^2$ of a blasting pressure with a mixed abrasive solution which consists of water and aluminum oxide with a grain size of from 20 to 30 microns, mixed at a ratio of 2:1 by volume. The lead frame thus treated is then heated to 80°C. by means of a high frequency heater. Thereafter, the lead frame is molded intregal with the header fabricated from a molding material of powdery epoxy resin, made by Nitto Electric Industrial Co., Ltd. under a condition of 150°C. of temperature, 70 Kg/cm$^2$ of pressure and 10 mm/sec of plunger injection rate by means of a transfer molding machine, leaving an outer lead frame portion to be socketed which was not subjected to the liquid honing treatment. In the molding process, a ledge to mount a cap is formed on the molded header, and the lead frame is molded with the molding material in such a manner that the semiconductor element and the lead frame portion to be wire-bonded are exposed within the cavity.

Thereafter, the lead frame exposed within the cavity and the ledge to mount the cap are liquid-honed with the same abrasive solution as the described above, using the same liquid honing apparatus. By the liquid honing treatment, contaminants, such as powdery dusts, on the lead frame portion exposed within the cavity may be removed, and the increased adherence may also be obtained on the ledge to mount the cap thereon.

Figure 1:
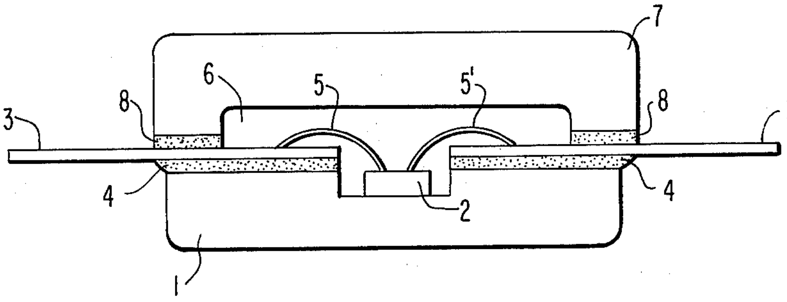
FIG. 1 PRIOR ART
FIG. 1 is a sectional view of a cavity molded type semiconductor device of the prior art.
Figure 2:
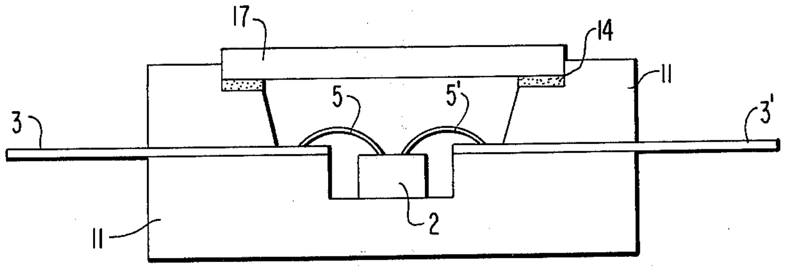
FIG. 2 PRIOR ART
FIG. 2 is a sectional view of another cavity molded type semiconductor device of the prior art.
Figure 3:
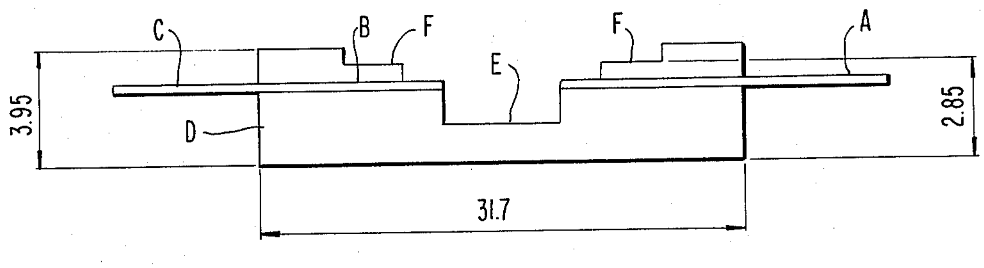
FIG. 3 is a sectional view of a molded header incorporating the improved lead frame of the present invention.

The lead frame exposed within the cavity is then gold-plated by a partial plating method to obtain a lead frame molding. The lead frame moldings thus obtained is shown in FIG. 3. In the drawing, (A) is the Kovar lead frame, and (B) is the portion of the lead frame subjected to the liquid honing treatment and molded within the molded header. (C) is the portion of the lead frame which is not subjected to the liquid honing treatment, that is, the portion to be socketed. (D) is the molded header of molding material of epoxy resin. (E) is the cavity to place the semiconductor element. (F) is the ledge to mount the cap thereon. The size of the molding portion if 31.7 mm length, 13.5 mm width and 3.95 mm thickness, respectively. The size of the cavity to place the semiconductor element is 7.5 mm length, 6.0 mm width and 0.9 mm thickness, respectively. The size of the cap to be mounted on the platform is 16.2 mm length, 13.5 mm width and 1.0 mm thickness, and the semiconductor element is hermetically sealed by binding and mounting the cap on the ledge to obtain the semiconductor device. in FIG. 3, each value is represented by mm.

The following shows the results of characteristic tests of the lead frame moldings shown in FIG. 3. A helium leakage test was made according to MIL STD 883 Method 1014 in order to examine the airtight property of the lead frame and the molded portion.

The results of measurement are shown in Table 1.

Table 1

| Characteristic value. | Sample Example of the invention | Comparative Example |
|---|---|---|
| Initial value | 0/80 | 0/80 |
| Thermal test after 6 cycles | 0/80 | 1/80 |
| P. C. 5 cycles | 0/80 | 12/80 |
| C. 10 cycles | 0/80 | 18/80 |
| T. 20 cycles | 0/80 | 37/80 |

In Table 1, the initial value represents a result of helium leakage test of the lead frame moldings just after fabrication thereof. The thermal test after 6 cycles represents a result of the helium leakage test after one thermal cycle, which represents that the lead frame molding is cooled in air at −65°C. for 20 minutes and then heated in air at 150°C. for 20 minutes, is repeated six times.

P.C.C.T. is a pressure cooker cycle test, one cycle of which is that the lead frame moldings is placed in water vapor (under a pressure) of 125°C. for 30 minutes and then immersed into water of room temperature to 30 minutes. In Table 1, the helium leakage tests are carried out after 5, 10, 20 cycles respectively. In this case, the lead frame moldings that the thermal test of 6 cycles has been finished is used as the lead frame moldings employed in P.C.C.T.

Each value in Table 1 represents an accumulated substandard rate in which the denominator indicates the total numbers of the lead frame moldings used in the helium leakage test and the numerator indicates the numbers of substandard moldings at the result of the helium leakage test. At the result of the helium leakage test, the lead frame moldings indicating more than $10^{-7}$ Torr/Sec of leak are substandard moldings. This is the reason why itis generally known in the industry that the semiconductor devices with more than $10^{-7}$ Torr/Sec of leak are not preferable when the airtight property of semiconductor devices are tested.

In Table 1, "Comparative Example" represents that a lead frame which was not prepared with the liquid honing treatment as in the invention, and each value represents the accumulated substandard rate of such lead fram moldings.

As it will be apparent from the experimental results, the semiconductor devices with excellent airtight property can be obtained, and it can greatly be contributed to the semiconductor device so as to protect the semiconductor element from the affect of atmosphere.

What is claimed is:

1. A method of making a plastic sealed cavity molded type semiconductor device having a header portion with a cavity therein for mounting a semiconductor device, a lead frame extending through the header portion into the cavity and a cap portion mounted on the header portion to seal the cavity from ambient atmosphere comprising the steps of:

a. masking that portion of said lead frame which will extend outside of said header with a masking plate,
b. subjecting said masked lead frame to a liquid honing treatment to roughen the surface of the unmasked portions;
c. heating the liquid honed lead frame to 80° C.;
d. placing the lead frame into a mold and molding the header around a first roughened portion of said lead frame, such that a second roughened portion of the lead frame extends into a cavity in the header;
e. subjecting the header and that second roughened portion of the lead frame extending into the cavity to a liquid honing treatment to further roughen the surface of the lead frame and the header surface to which is to be attached a cap portion;
f. gold plating that portion of the lead frame extending into the cavity;
g. mounting a semiconductor device in the cavity in the header portion;
h. connecting internal lead wire between the semiconductor device and the lead frame; and
i. mounting the cap portion on the header portion.

2. The method of claim 1 wherein said liquid honing is achieved by subjecting those surfaces to a liquid stream consisting of water and aluminum oxide in a mixture of 2 parts water to 1 part aluminum oxide.

3. The method of claim 2 wherein the aluminum oxide has a grain size in the range of from 20–30 microns.

4. The method of claim 2 wherein the liquid honing stream has a flow rate of 1 Sec/cm$^2$ and a pressure of 3 Kg/cm$^2$.

5. The method of claim 1 wherein the molding of the header portion around the lead frame is accomplished by injection molding an epoxy resin powder.

6. The method of claim 5 wherein the epoxy resin powder is heated to 150° C. prior to molding, subjected to a pressure of 70 Kg/cm$^2$ and a plunger injection rate of 10 mm/Sec.

* * * * *